United States Patent [19]
Thomson

[11] Patent Number: 5,339,021
[45] Date of Patent: Aug. 16, 1994

[54] CASCADED RESISTANCE LADDER ATTENUATOR NETWORK

[75] Inventor: David Thomson, Fremont, Calif.

[73] Assignee: Analog Devices, Inc., Norwood, Mass.

[21] Appl. No.: 21,804

[22] Filed: Feb. 24, 1993

[51] Int. Cl.$^5$ .............................................. H03H 7/26
[52] U.S. Cl. .................................. 323/354; 333/81 R
[58] Field of Search ............... 323/297, 353, 354, 367; 338/260, 295, 320; 333/81 R

[56] References Cited

U.S. PATENT DOCUMENTS

| | | | |
|---|---|---|---|
| 4,467,286 | 8/1984 | Stitt | 333/81 R X |
| 4,468,607 | 8/1984 | Tanaka et al. | 323/354 |
| 4,990,868 | 2/1991 | Barbour | 333/81 R |

OTHER PUBLICATIONS

Toshiba Integrated Circuit Technical Data, TC9212P, TC9213P.
Precision Monolithics, Inc. Analog Integrated Circuits Data Book, vol. 10, 1990, pp. 11-260.
Grebene, Bipolar and MOS Analog Integrated Circuit Design, John Wiley & Sons, 1984, pp. 758-760 and 773-777.

Primary Examiner—Emanuel T. Voeltz
Attorney, Agent, or Firm—Koppel & Jacobs

[57] ABSTRACT

A voltage attenuation network includes one or more cascaded resistor ladder stages, with decremented voltage taps provided at successive cascaded steps within each stage. Each stage includes a termination step having a resistance value Ri equal to the stage input impedance, series step resistors with resistance values $Ri(1-A)/A$ and shunt step resistors with resistance values $Ri/(1-A)$, where A is a step-to-step voltage attenuation factor. The input resistances of each step within a given stage are substantially equal, eliminating the need for output buffers at the step taps. A pair of switches are provided for each step, including an output switch connected between the step input node and a common output line, and a shunt switch connected in series with the shunt resistor for that step. Only one output switch is closed at a time, and only the corresponding shunt switch for the same step is opened. Multiple stages can be cascaded to provide a progressively finer voltage decremention, with the input impedance for each stage equal to the shunt resistance values for the preceding stage.

20 Claims, 1 Drawing Sheet

CASCADED RESISTANCE LADDER ATTENUATOR NETWORK

BACKGROUND OF THE INVENTION

1. Field of the Invention

This invention relates to attenuator circuits, and more particularly to attenuator circuits that employ resistor ladders to provide selectable attenuation levels.

2. Description of the Related Art

Variable voltage attenuation circuits are employed in applications such as audio recording and playback. Perhaps the simplest form of a variable or selectable attenuator is a chain of series resistors, with taps taken between successive resistors in the chain. Due to the different impedance at each tap, the tapped voltage signals require buffering before they can be connected to additional attenuation circuits that may be desired to provide a wider attenuation range. The buffer circuits, however, add undesirable levels of noise, voltage offset and gain errors, and require relatively large amounts of area.

One form of a series resistor chain is employed in the Toshiba Corporation TC9213 attenuator, which provides a logarithmic attenuation. To cover the relatively large attenuation range, parallel resistors of relatively higher resistance values are used to implement the low effective resistances required at the lower end of the chain. The use of higher resistance value elements in parallel facilitates the achievement of more accurate low resistance values, However, buffer amplifiers with their attendant disadvantages are still required between successive attenuation circuits.

Another way to achieve a variable attenuation is to control the gain or attenuation setting of a logarithmic voltage controlled amplifier (VCA) with a linear digital-to-analog converter (DAC). If the DAC output is negative, the circuit will operate as an attenuator. This approach is illustrated, for example, in the Precision Monolithics, Inc. Analog Integrated Circuits Data Book, volume 10, 1990, page 11–260 in connection with the DAC-8800 converter and the SSM-2014 VCA. However, the required circuitry is considerably more complex than for a simple resistive voltage divider.

DACs themselves commonly use R-2R resistor ladders for transforming a digital signal into an accumulation of binarially-weighted bits to produce an output analog signal. An R-2R ladder consists of a chain of resistors with resistance value R in series, with each series resistor shunted by a resistor of value 2R. With the addition of a termination resistor of value 2R after the last series and shunt resistors, the input resistance at each step of the ladder is equal to R. The use of an R-2R resistor ladder in a current-mode configuration is described in Grebene, Bipolar and MOS Analog Integrated Circuit Design, John Wiley & Sons, 1984, page 758–760 and 773–777, while a voltage-mode DAC configuration is shown, for example, on page 11–202 of the Precision Monolithics, Inc. Data Book mentioned above in connection with the PM-7226 Quad No. 8 Bit CMOS DAC. Each of the shunt resistors in the voltage-mode design is switched into or out of the ladder, depending upon the input digital signal. The ladder functions in effect as a digitally controlled variable resistor, but does not provide an accessible voltage decrementation.

SUMMARY OF THE INVENTION

The present invention seeks to provide a selectable voltage attenuation network that allows successive attenuation stages to be combined in a cascade configuration to yield a wide range of possible output voltage levels with a high resolution, that does not require buffer amplifiers between successive stages, and allows relatively small resistors to be used with a range of resistance values significantly less than the range of possible output voltages.

These goals are achieved with an overall resistor ladder network that is formed from a series of cascaded resistor ladder stages. Within each stage the series resistors have a value that yields the desired step-to-step voltage attenuation, while the shunt resistance values are selected to establish a desired input impedance $R_i$ at each step. For a step-to-step attenuation factor $A$, the first resistor values are equal to $R_i(1-A)/A$, while the shunt resistor values are equal to $R_i/(1-A)$.

The input to each step is tapped with an output switch, the other side of which is connected to a common output line for that stage. A shunt switch is provided in series with each shunt resistor, and operated in tandem with the output switch for the same step. Only one of the output switches within a given stage is closed at a time, with the corresponding shunt switch opened to connect the decremented voltage signal for that step to the stage output line.

Regardless of which one of its steps is connected to the output line, the input impedance for any given stage (after the first stage) is matched with the output impedance of the immediately preceding stage in the cascade connection. This is accomplished by selecting the series and shunt resistance values for the given stage so that its input resistance equals the shunt resistance value at each step of the preceding stage. This matching of successive attenuation stage resistances, together with the equal input resistances at each step within a given ladder, allows the overall network to be implemented without buffer amplifiers between successive stages. With the resistance values for the various stages selected to produce a progressively finer voltage decremention from stage-to-stage, a high resolution in the output voltage signal can be achieved.

These and other features and advantages of the invention will be apparent to those skilled in the art, taken together with the accompanying drawings.

DETAILED DESCRIPTION OF THE INVENTION

Figures 1, 2:
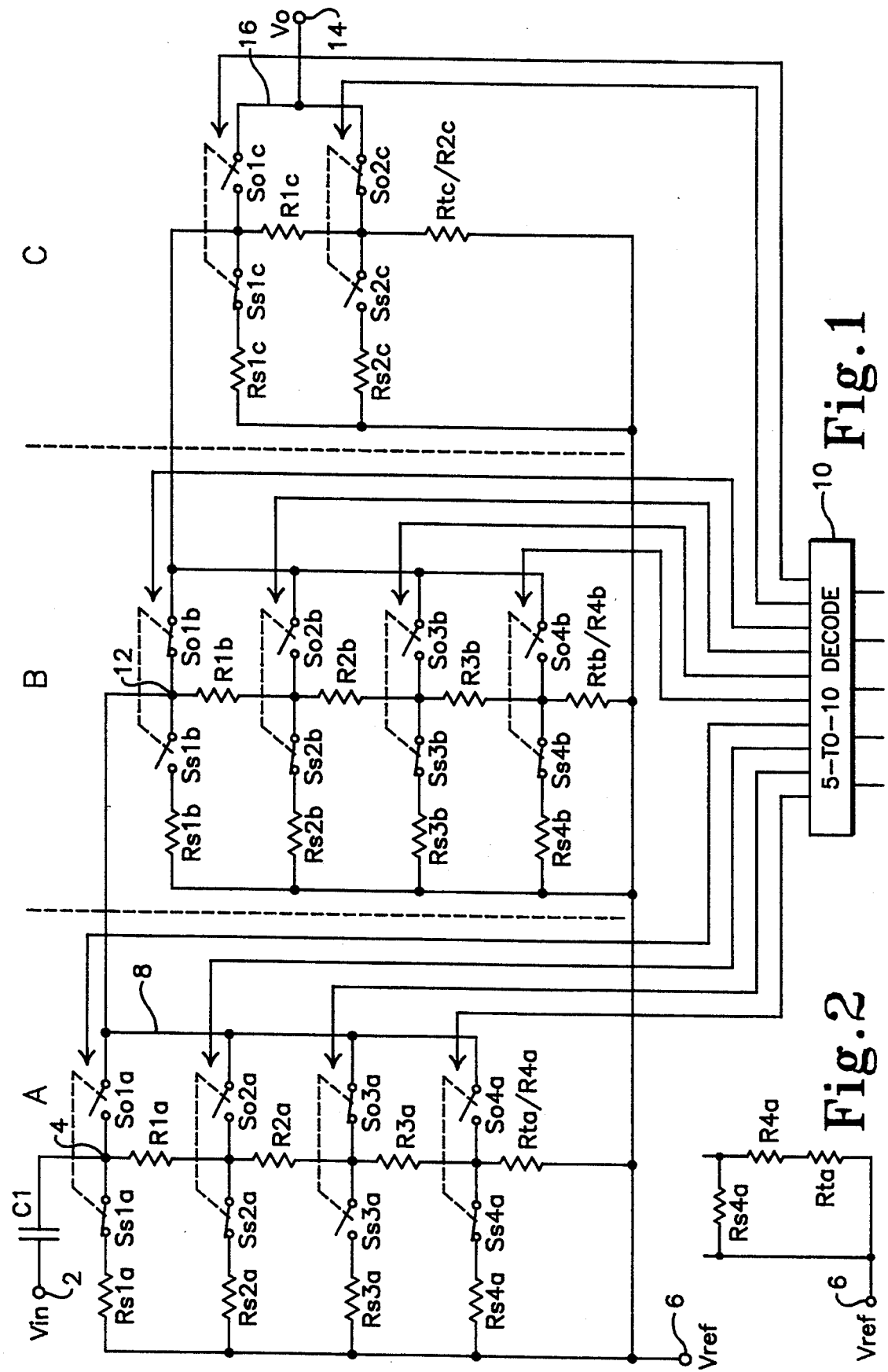
FIG. 1 is a schematic diagram of a high resolution, selectable voltage attenuation network in accordance with the invention.
FIG. 2 is a schematic diagram showing a termination step broken out from the preceding step for the first stage in the attenuation network of FIG. 1.

A schematic diagram of a voltage attenuator network that is implemented in accordance with the invention is shown in FIG. 1. It is divided into three cascaded stages A, B and C, although any desired number of stages may be employed depending upon the resolution and range of the desired voltage decremention. Each stage includes a resistance ladder that divides the input voltage to the stage into decremented voltage values. The resolution of the voltage decrements for the input stage A is preferably the coarsest, with each stage in succession having a progressively finer resolution. For example, the first stage A might attenuate the input voltage in −8dB steps, with stage B dividing the output of stage A in −2dB steps, and then stage C attenuating the output from stage B in −1dB steps.

Each of the ladder networks A, B and C have a generally similar design, although the number of steps can vary from stage to stage. In the illustrative circuit of FIG. 1, stages A and B have four cascaded steps each, while stage C has two cascaded steps. An input voltage signal Vin is applied to an input node 2, with a DC decoupling capacitor C1 provided between the input node and stage A if desired.

Each step of the various stage ladders includes a series resistor and a shunt resistor. The series resistors are designated R, followed by a number which indicates the order of the step within the stage and a letter which indicates the stage, while the shunt resistors are designated Rs, also followed by the step order and the stage letter. Thus, resistor $R1a$ refers to the series resistor for the first step of stage A, while resistor $Rs3a$ refers to the shunt resistor for the third step of stage A; similar resistor nomenclatures are used for stages B and C.

The series resistors $R1a$–$R4a$ for stage A are connected in series between the stage input node 4 at the input for the first step, and a voltage reference node 6 (which could be ground potential). The series resistor $R4a$ for the fourth step is connected in series with a stage termination resistor Rta; for convenience these two resistors are implemented as a single resistor element having a resistance value equal to the sum of the desired values for $R4a$ and Rta. The shunt resistors are connected between the input nodes for their respective steps and Vref. Thus, shunt resistor $Rs1a$ is connected on one side to the input node for the first step (the high voltage side of series resistor $R1a$), shunt resistor $Rs2a$ is connected on one side to the input node for the second step (the high voltage side of its corresponding series resistor $R2a$), etc. As described below, the values of the series and shunt resistors are selected to establish equal input impedances at the input to each successive step, thus allowing a voltage signal to be tapped from any one of the steps and applied to a succeeding stage for further decremention, without the need for buffer amplifiers to compensate for differing input impedance values. The selection of particular resistance values also establishes a logarithmic attenuation factor between each successive step of the stage, which is normally constant but may also be variable. Furthermore, the values of the shunt resistors are selected to equal the input resistance for the succeeding stage, which further contributes to the avoidance of buffer amplifiers.

Each step in the ladder circuit also includes a pair of switches that are operated in tandem, with one switch closed while the other is open and vice versa. The first switch is an output switch that allows an output voltage to be tapped from the respective step, while the other switch is a shunt switch that is connected in series with the step's shunt resistor. The switch nomenclature employed in FIG. 1 is similar to that for the series and shunt resistors, with the output switches designated So, the shunt switches Ss, the output switch for the first step in stage A identified as $So1a$, the shunt switch for the second step of stage A identified as $Ss2a$, etc. The switches can conveniently be implemented as MOS transistors, although numerous other implementations are also available.

The resistance values for each of the series and shunt resistors are selected to produce both the desired step-to-step voltage attenuation, and equal input impedances at each step within a given stage. To illustrate the manner in which the resistance values are calculated, the termination resistor Rta is shown together with the last pre-termination step of stage A in FIG. 2. For simplification the switches are omitted and the termination resistor Rta and series resistor $r4a$ of the preceding step are shown as separate devices, although normally they would be integrated into a single resistor. Separating these resistors, however, allows for an additional voltage attenuation tap to be taken between them if desired.

Since the input impedance at each step of the ladder circuit is equal to the same value Ri, the value of the termination resistor Rta is Ri. The value of $R4a$ is then determined from the desired step-to-step attenuation A. (Aa for the stage A attenuation, Ab for the stage B attenuation, etc.). For example, if a −8dB per step attenuation is desired in stage A, the voltage at the input to each step will be 0.398 times the voltage at the input to the preceding step (Aa=0.398). It can be shown that an attenuation Aa will result from the series voltage divider circuit $R4a$/Rta, with Rta set equal to Ri, if the value of $R4a$ is Ri(1−Aa)/Aa. A value of 1.513 Ri for $R4a$ results when Rta equals Ri and Aa=0.398.

When the values of Rta and $R4a$ are thus determined, the value of the shunt resistor $Rs4a$ is selected to set the input impedance for the $R4a$/$Rs4a$ step equal to Ri. $Rs4a$ is connected in parallel with the series circuit consisting of $R4a$ and Rta. Given the values previously determined for these series resistors, it can be shown that a resistance value of Ri/1−Aa) for the shunt resistor $Rs4a$ will produce a step input impedance of Ri.

The values of the step and shunt resistors for the other steps are also equal to Ri(1−Aa)/Aa and Ri/(1−Aa), respectively. This follows from the fact that the series resistor $R3a$ for the third step is connected in series with the fourth step, whose input impedance has just been shown to be equal to Ri. Thus, for the same attenuation factor A between step 3 and step 4, the value of $R3a$ is the same as the value of $R4a$ (which also faced a succeeding step with an input impedance equal to Ri). The shunt resistor $Rs3a$ will also have the same value as $Rs4a$ to keep the input impedance for the third step equal to Ri. In a similar fashion for the same step-to-step attenuation factor Aa and the same step input impedance Ri, the values of the series and shunt resistors for the first and second steps will be the same as the corresponding resistor values for the third and fourth steps. As a specific example, for an input impedance of 10 kohm and an attenuation factor of 0.398, the series resistors $R1a$–$R4a$ will have values of 15.129 kohm, and the shunt resistors $Rs1a$–$Rs4a$ will have values of 16.611 kohm.

All of the output switches So for stage A are connected between the input nodes to their respective steps, and a common stage output line 8. A switch control scheme is provided to close only one of these output switches at a time, leaving the remaining output switches open, and at the same time to open only the shunt switch Ss that corresponds to the closed output switch, leaving the remaining shunt switches closed. Many different types of switch controls can be used. For the system illustrated in FIG. 1, 5-to-10 decode circuit 10 receives a 5-bit digital input and translates this into an output to control the switches in stages A, B and C. The output from stage A is taken from the step whose output switch is closed. This is illustrated as switch So3a in FIG. 1; all of the other output switches are open. The corresponding shunt switch Ss3a is open, while all of the other shunt switches are closed. Since the stage output line 8 is connected to the input node 12 of stage B, stage B in effect substitutes for shunt resistor Rs3a to establish an effective shunt resistance for the third step in stage A. If the values of the resistors in stage B are selected so that the stage B input impedance is equal to the resistance value of Rs3a, the impedance matching between stages A and B will be preserved.

Assume that in stage B it is desired to further decrement the output of stage A in −2dB steps. Four stage B steps are provided for this purpose, allowing for an equal voltage decrementing of the −8dB steps from stage A. The stage B attenuation factor Ab that corresponds to −2dBV is 0.794. Setting the termination step resistance Rtb for stage B equal to the stage B input impedance, the values of the series resistors R1b–R4b equal to the input impedance times (1−Ab)/Ab, and the values of the shunt resistors RSs1b–Rs4b equal to the stage B input impedance divided by (1−Ab), yields a value of 16.61 kohm for the stage B input impedance, 4.31 kohm for the stage B series resistors, and 80 kohm for the stage B shunt resistors.

The stage B switches are controlled by decoder 10 in a manner similar to stage A. The output switch So1b for the first step is illustrated as closed and the other output switches open in FIG. 1, with the shunt switch Ss1b for the first step open and the remaining shunt switches closed. With this switching configuration, stage B is effectively bypassed and does not add to the final attenuation. Closing a different one of the output switches would, of course, further decrement the attenuation from stage A.

To provide a −1dB resolution to the −2dB steps of stage B, the final stage C has output taps for two steps preceding the termination step Rtc. The resistance values for stage C are selected to establish a stage input impedance equal to the shunt resistor values of stage B, and also to set the step-to-step attenuation at −1dB. With the illustrative values given above for stages A and B, this is achieved by setting the stage C termination resistor Rtc at 80 kohm, the series resistors R1c and R2c at 9.2 kohm, and the shunt resistors Rs1c and Rs2c at 690 kohm. The final output from the overall attenuation network, taken at an output node 14 connected to the stage C output line 16, covers a range of 0−31dB in 1dB attenuation steps.

The invention has been described thus far in terms of a constant step-to-step logarithmic attenuation within each stage. However, it is also applicable to non-linear attenuation situations, such as in switching from a linear audio attenuation to a mute, or an automatic gain control configuration in which the degree of attenuation rises or falls when a threshold level is exceeded. This involves simply recalculating the applicable series resistance values for the new attenuation factor A in the effected steps. The termination resistor in each stage will still be equal to the stage's input impedance, and the shunt resistance values are still selected to maintain a constant input impedance at each step within a given stage.

Optimally, the need for step output buffers will be entirely eliminated, while the range of resistance values will proportionately be much less than the output voltage range. However, if the circuit's supply voltage is relatively low (e.g., 5 volts) and the input signal range is relatively high (e.g., 3 volts), the voltage at the first tap from stage A can be comparable to the supply voltage, and this can result in undesired distortion. The distortion can be reduced by using a buffer amplifier at the first tap.

While particular embodiments of the invention have been shown and described, numerous variations and alternate embodiments will occur to those skilled in the art. Accordingly, it is intended that the invention be limited only in terms of the appended claims.

I claim:

1. A resistor ladder network with a base ladder voltage attenuator stage having a desired input resistance Ri, comprising
   a reference voltage node,
   a termination attenuation step comprising a resistor of resistance value Ri connected between an input node for said step and said reference voltage node,
   a plurality of pre-termination attenuation steps connected in cascade and terminated by said termination step, each of said pre-termination attenuation steps comprising a respective input node, a respective series resistor having a resistance value $$\frac{Ri(1 - A)}{A}$$

connected between its respective input node and the input node for the next successive step, and a respective shunt resistor having a resistance value $$\frac{Ri}{1 - A}$$

connected between its respective input node and said reference voltage node, where A is a constant step-to-step attenuation factor for each of said pre-termination steps that yields equal step attenuations, the input nodes for at least some of said steps providing output taps for obtaining progressively attenuated voltage signals from said attenuator stage, and the input resistances of each of said attenuation steps being substantially equal,
   an output lie,
   respective output switches between said output line and the input nodes of said attenuation steps,
   respective shunt switches controlling the flow of current from the input nodes of said steps through their respective shunt resistors, and
   a switch control for closing the output switch for only one step at a time and for opening the shunt switch only in the same step as the closed output switch.

2. The resistance ladder network of claim 1, further comprising at least one additional ladder voltage attenuator stage of similar design to said base attenuator stage but with different respective input resistance $Ri_k$, where k is the order of the stage, $Ri_k$ being different for each additional stage and different from Ri, said additional attenuator stages including respective series resistor values of $$\frac{Ri_k(1 - A_k)}{A_k}$$

and respective shunt resistor value $$\frac{Ri_k}{1-A_k},$$

where $A_k$ is a step-to-step attenuation factor for said additional attenuator stages, said additional stages being connected in cascade with said base attenuator stage.

3. The resistance ladder network of claim 2, wherein at least some of said additional attenuator stages include:
- an output line connected to an input node for the next attenuator stage (or to a stage output in the case of the last attenuator stage),
- respective output switches between the circuit's output line and the input nodes for the attenuation steps within the stage, and
- respective shunt switches controlling the flow of current from the input nodes of said steps to their respective shunt resistors,
- said switch control closing the output switch for only one step at a time within each stage and opening the shunt switch only in the step that includes the closed output switch within each stage.

4. The resistance ladder network of claim 2, wherein the resistance value of the shunt resistors for each of said stages, except for the last, are equal to the input resistance of the next cascaded stage.

5. The resistance ladder network of claim 4, wherein said attenuator stages are connected directly in cascade without buffer amplifiers between stages.

6. The resistance ladder network of claim 1, wherein said termination step and its input node are formed integrally with the first resistor for the step that immediately precedes said termination step.

7. A resistor ladder network with a base ladder voltage attenuator stage that has a desired input resistance $Ri$ and comprises:
- a termination step,
- a plurality of pre-termination attenuation steps that are cascaded with each other and with said termination step, each of said pre-termination steps comprising a first resistor that is connected in a respective voltage divider stage with the downstream portion of the ladder to provide a desired voltage attenuation, and a second resistor that is connected in parallel with said voltage divider stage to yield an input step resistance substantially equal to $Ri$, the input impedances of each of said attenuation steps being substantially equal,
- a plurality of output taps from at least some of said steps providing progressively attenuated voltage signals from said attenuator stage,
- an output line,
- respective output switches between said output line and the input nodes of said attenuation steps,
- respective step switches controlling the flow of current from the input nodes of said steps through their respective step resistors, and
- a switch control for closing the output switch for only one step at a time and for opening the step switch only in the step that includes the closed output switch.

8. The resistance ladder network of claim 7, wherein said first resistors have respective resistance values $$\frac{Ri(1-A)}{A}$$

and said second resistors have respective resistance values $$\frac{Ri}{1-A},$$

where $A$ is a step-to-step attenuation factor.

9. The resistance ladder network of claim 7, further comprising at least one additional ladder attenuator stage of similar design to said base attenuator stage but with mutually different respective input resistances, said additional attenuator stages connected in cascade with said first attenuator stage.

10. The resistance ladder network of claim 9, said attenuator stages including respective switching networks for selecting an output from among different steps in the stage for presentation to the next cascaded stage (or to a stage output in the case of the last stage).

11. The resistance ladder network of claim 10, wherein the resistance values of the second resistors for each of said stages, except for the last, are equal to the input resistance of the next cascaded stage.

12. The resistance ladder network of claim 11, wherein said stages are connected directly in cascade without buffer amplifiers between said stages.

13. A selectable voltage attenuation stage, comprising:
- an input node,
- a reference voltage node,
- an output line,
- a plurality of voltage decremention steps connected in cascade between the input and reference voltage nodes, each step including:
  - a first resistor that is connected to a step input in a respective voltage divider stage with the following steps to provide a desired voltage decremention,
  - a second resistor that is connected in parallel with the voltage divider stage to yield an input step resistance that is substantially equal tot he input resistances of the other steps,
  - an output switch connected between the step input and said output line, and
  - a step switch connected in series with said second resistor,
- a termination resistor connected in series with the first resistor for the last decremention step to provide said step with said equal input impedance, and
- a switch control for closing only one of said output switches at a time while leaving the other output switches open, and for opening only the step switch for the step that includes the closed output switch while leaving the other step switch closed.

14. The selectable voltage attenuation stage of claim 13, wherein the first resistors for each of said steps have equal resistance values, and the second resistors for each of said steps have equal resistance values.

15. The selectable voltage attenuation stage of claim 13, wherein said termination resistor is provided integrally with the first resistor for the last step as a single resistor structure.

16. A high resolution voltage attenuation network, comprising:

a) a plurality of voltage attenuation stages connected in cascade between a network input node and a reference voltage node, each of said voltage attenuation stages comprising:
  1) an input stage node,
  2) an output line,
  3) a plurality of voltage decremention steps connected in cascade between the input stage and reference voltage nodes, said steps including:
     i) a first resistor that is connected to a step input in a respective voltage divider stage with the following steps to provide a desired voltage decremention,
     ii) a second resistor that is connected in parallel with the voltage divider stage to yield a step input resistance that is substantially equal to the input resistances of the other steps,
     iii) an output switch connected between the step input and said output line, and
     iv) a step switch connected in series with said second resistor, and
  4) a termination resistor connected in series with the first resistor of the last decremention step to provide said step with said equal input impedance, and b) a switch control for closing only one of the output switches in each voltage attenuation stage at a time while leaving the other output switches open, and for opening only the step switch in each stage for the step that includes the closed output switch while keeping the other step switches closed, c) The resistance values of the second resistors for each of said stages, except for the last, being equal to the input resistance of the next cascaded stage.

17. The voltage attenuation network of claim 16, wherein said resistors are selected to decrement the voltages at successive step inputs in equal logarithmic steps within respective stages.

18. The voltage attenuation network of claim 17, wherein the logarithmic decremention steps for each stage are different from the decremention steps for the other attenuation stages.

19. The voltage attenuation network of claim 18, wherein the logarithmic decremention steps progressively decrease for successive cascaded attenuation stages.

20. The voltage attenuation network of claim 16, wherein said stages are connected directly in cascade without buffer amplifiers between stages.

* * * * *